United States Patent
Woith

Patent Number: 5,436,568
Date of Patent: Jul. 25, 1995

[54] PIVOTABLE SELF-CENTERING ELASTOMER PRESSURE-WAFER PROBE

[75] Inventor: Blake F. Woith, Orange, Calif.

[73] Assignee: Hughes Aircraft Company, Los Angeles, Calif.

[21] Appl. No.: 187,418

[22] Filed: Jan. 25, 1994

[51] Int. Cl.⁶ .............................................. G01R 1/04
[52] U.S. Cl. .................................. 324/758; 324/73.1
[58] Field of Search ............... 324/158 F, 158 P, 754, 324/756–758, 73.1

[56] References Cited

U.S. PATENT DOCUMENTS 4,065,717 12/1977 Kattner et al. ..................... 324/72.5
4,906,920 3/1990 Huff et al.

Primary Examiner—Kenneth A. Wieder
Assistant Examiner—Barry C. Bowser
Attorney, Agent, or Firm—Elizabeth E. Leitereg; Terje Gudmestad; W. K. Denson-Low

[57] ABSTRACT

A test probe for testing an integrated circuit formed on an integrated circuit die. The probe comprises a printed circuit board interface having an opening in its center. A flexible membrane is formed on a bottom surface of the printed circuit board interface that is flexible in the middle thereof. A plurality of electrical traces and a plurality of bumps are formed on the flexible membrane that terminate at a plurality of termination pads that permit interfacing of the integrated circuit to the external test equipment. A clear plastic window is secured to the printed circuit board interface an a portion thereof protrudes into the opening in the interface. A cone shaped retainer having a circular opening at its center that abuts a bottom surface of the clear plastic window. A pivotable elastomer member having a truncated conical cross section abuts the bottom surface of the clear plastic window. A clear plastic pressure and pivot plate is disposed between the flexible membrane and a bottom surface of the pivotable elastomer member. When the probe is assembled, the flexible membrane is disposed in its flexed position, extending outward relative to the non-flexible portion thereof. The flexible membrane is moved into its flexed position by the force created by the force exerted thereon by the pivotable elastomer member and clear plastic pressure and pivot plate. The elastomer member compresses during interconnection to the integrated circuit, and deflects, as required, to permit tilting of the flexible membrane and thus proper mating of the bumps and pads on the integrated circuit. Upward movement of the die and integrated circuit provides the force to ensure contact between the bumps and pads and to tilt the flexible membrane when required. The probe is especially suitable for very small integrated circuit die patterns, such as are used in testing die whose die patterns are less than 250 inches square.

20 Claims, 2 Drawing Sheets

1

PIVOTABLE SELF-CENTERING ELASTOMER PRESSURE-WAFER PROBE

BACKGROUND

The present invention relates generally to probes, and more particularly to a pivotable self-centering elastomer pressure-wafer probe for use in testing integrated circuit die.

The assignee of the present invention manufactures membrane wafer probes for use in testing integrated circuit die. These membrane wafer probes use coil springs and center pivots to activate a membrane. The membrane must be planar to the wafer under test and provide a desired amount of contact force. The use of coil springs and center pivots to actuate the membrane works well for large die patterns that are approximately 250 inches square or larger. However, these components will not fit into the center space of very small die patterns. Consequently, it is not possible to test the integrated circuit die using these membrane wafer probes.

It is therefore an objective of the present invention to provide for a pivotable self-centering elastomer pressure-wafer probe for use in testing integrated circuit die that overcomes the limitations of the conventional probe that uses coil springs and center pivots to activate a membrane.

SUMMARY OF THE INVENTION

The present invention is a mechanism that utilizes clear elastomer, plastic and metallic parts to provide the driving and planarizing force essential to operate an integrated circuit wafer membrane probe. The present invention is especially suitable for very small integrated circuit die patterns where large springs and pivots used in conventional probes do not fit. The present invention utilizes a cone shaped, molded, clear elastomer member and other specific shaped pans to replace the coil spring and center pivot of the conventional probe described above while providing the same essential movements and action.

More particularly, the present invention is a test probe for testing an integrated circuit formed on an integrated circuit die. The probe comprises a printed circuit board interface having an opening in its center. A spongy, flexible membrane, comprising copper-coated polyimide, for example, is formed on a bottom surface of the printed circuit board interface that is flexible in the middle thereof. A plurality of electrical traces and a plurality of bumps are formed on the flexible membrane that terminate at a plurality of termination pads that permit interfacing of the integrated circuit to the external test equipment. A clear plastic window is secured to the printed circuit board interface an a portion thereof protrudes into the opening in the interface. A cone shaped retainer having a circular opening at its center that abuts a bottom surface of the clear plastic window. A pivotable elastomer member having a truncated conical cross section abuts the bottom surface of the clear plastic window. A clear plastic pressure and pivot plate is disposed between the flexible membrane and a bottom surface of the pivotable elastomer member.

When the probe is assembled, the flexible membrane is disposed in its flexed position, extending outward relative to the non-flexible portion thereof. The flexible membrane is moved into its flexed position by the force created by the force exerted thereon by the pivotable elastomer member and clear plastic pressure and pivot plate. The elastomer member compresses during interconnection to the integrated circuit, and deflects, as required, to permit tilting of the flexible membrane and thus proper mating of the bumps and pads on the integrated circuit. Upward movement of the die and integrated circuit provides the force to ensure contact between the bumps and pads and to tilt the flexible membrane when required.

The present invention may be used in wafer probes for testing integrated circuit die. The present invention is essential for small die probes, such as are used in testing die whose die patterns are less than 250 inches square, such as Motorola CT-2 die, for example, but may also be used for testing larger die.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
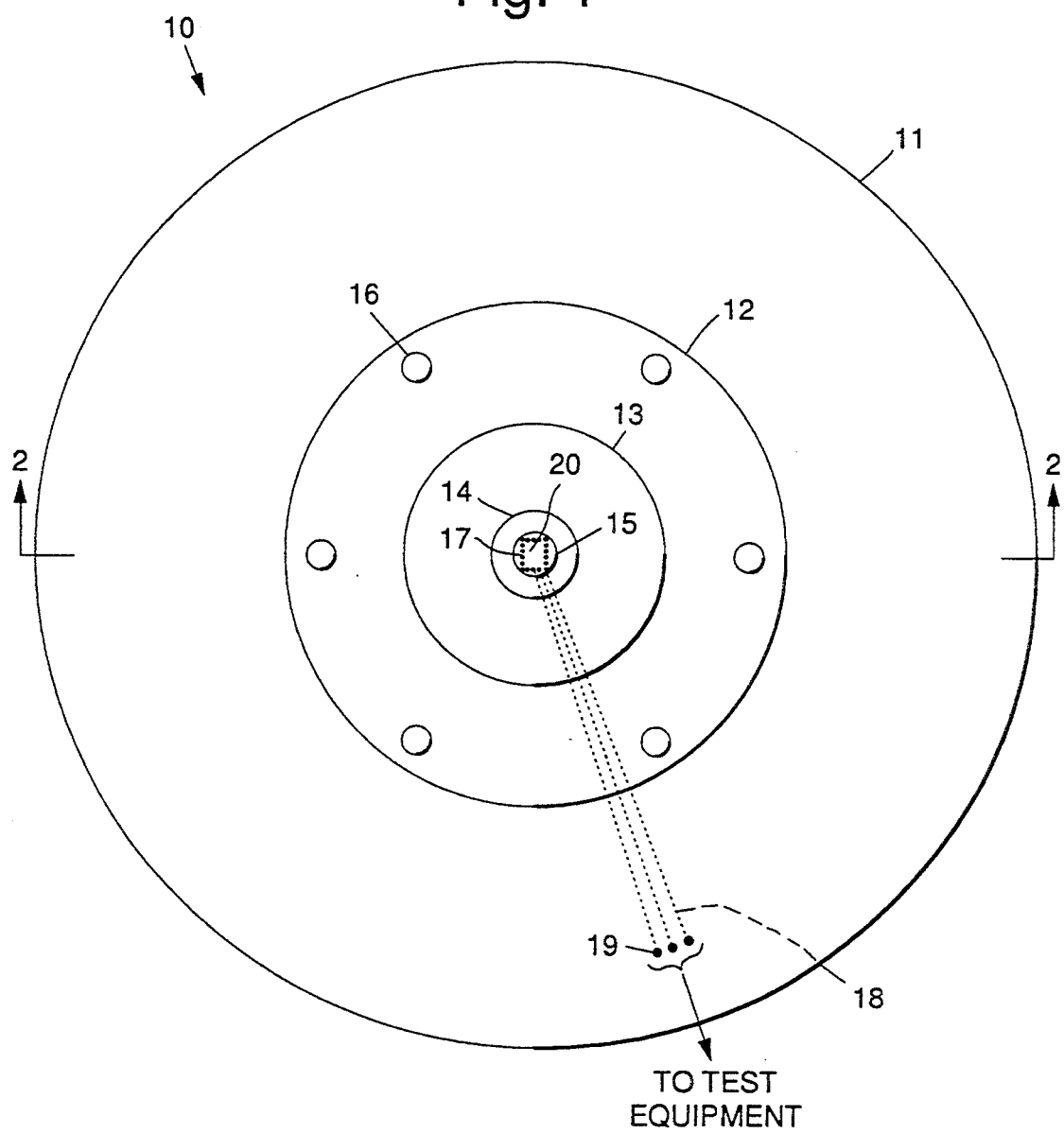
FIG. 1 illustrates a top view of a pivotable self-centering elastomer pressure-wafer probe made in accordance with the principles of the present invention.
Figure 2:
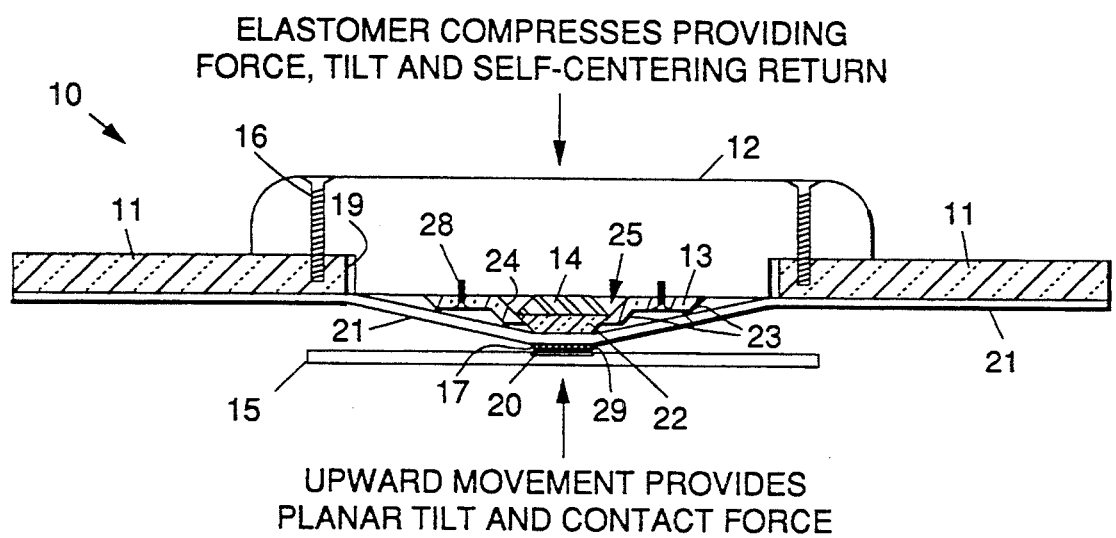
FIG. 2 illustrates a cross sectional side view of the pivotable self-centering elastomer pressure-wafer probe of FIG. 1.

Referring to the drawing figures, FIG. 1 illustrates a top view of a pivotable self-centering elastomer pressure-wafer probe 10 made in accordance with the principles of the present invention. FIG. 2 illustrates a cross sectional side view of the pivotable self-centering elastomer pressure-wafer probe 10 of FIG. 1. The pivotable self-centering elastomer pressure-wafer probe 10 is comprised of a printed circuit board interface 11 having an opening in its center. The printed circuit board interface 11 may be made of G-10 fiberglass, for example. A clear plastic window 12 is secured to a top surface of the printed circuit board interface 11 by means of screws 16, or the like, and a portion of the window 12 protrudes through the opening 19 such that its bottom surface is generally coplanar with the bottom surface of the printed circuit board interface 11. The clear plastic window 12 may be made of acrylic material, for example.

A spongy, flexible flexible membrane 21 is formed on the bottom surface of the printed circuit board interface 11. The flexible membrane 21 may be comprised of copper coated polyimide, for example. A plurality of electrical traces 18 are formed on the flexible membrane 21 and terminate at a plurality of termination pads 19 at one end and at the plurality of interconnect pads 17 on the other end. The plurality of electrical traces 18 permit interfacing of an integrated circuit die 15 to external test equipment (not shown). The use of polyimide material makes the membrane 21 flexible, while the copper permits formation of the electrical traces 18. The flexible membrane 21 may be formed the printed circuit board interface 11 by conventional printed circuit board fabrication techniques. The flexible membrane 21 is flexible in its center adjacent the opening 19 in the printed circuit board interface 11.

A cone shaped retainer 13 abuts a bottom surface of the clear plastic window 12. The cone shaped retainer 13 may be made stainless steel material, for example. The cone shaped retainer 13 is circular and has a stepped cross section with sloped outer and inner walls 23, 24. The cone shaped retainer 13 has a circular opening 25 at its center. The cone shaped retainer 13 is secured to the clear plastic window 12 by means of screws 28, for example.

A pivotable elastomer member 14 having the shape of a truncated cone abuts the bottom surface of the clear plastic window 12. The pivotable elastomer member 14 may be made of silicone material, for example. The pivotable elastomer member 14 is held against the bottom surface of the clear plastic window 12 by the pivotable elastomer member 14. A clear plastic pressure and pivot plate 22 has a first surface disposed in contact with the flexible membrane 21 and a second surface disposed in contact the bottom surface of the pivotable elastomer member 14. The pivotable elastomer member 14 and clear plastic pressure and pivot plate 22 are retained against the clear plastic window 12 by the cone shaped retainer 13. When the test probe 10 is assembled, the flexible membrane 21 is disposed in its flexed position, extending outward relative to the non-flexible portion thereof. The flexible membrane 21 is moved into its flexed position by the force created by the force exerted thereon by the pivotable elastomer member 14 and clear plastic pressure and pivot plate 22. This is shown in FIG. 2.

Figure 3:
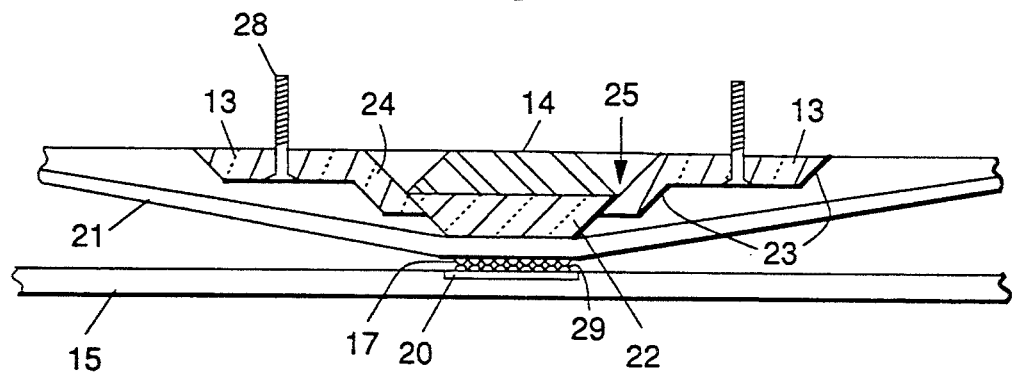
FIG. 3 illustrates an enlarged cross sectional view of the pivotable self-centering elastomer pressure-wafer probe of FIG. 1 detailing the center portion thereof.

FIG. 3 more clearly shows an enlarged cross sectional view of the pivotable self-centering elastomer pressure-wafer probe 10 of FIG. 1 detailing the center portion thereof. FIG. 3 shows the relative locations and cross sectional shapes of the cone shaped retainer 13, pivotable elastomer member 14, the flexible membrane 21, and the clear plastic pressure and pivot plate 22.

In operation, and with reference to FIGS. 2 and 3, the integrated circuit die 15 with its plurality of integrated circuits 20 formed thereon is moved and raised to a position below the center of the flexible membrane 21. A selected integrated circuit 20 that is to be tested is then positioned and pressed against the flexible membrane 21. The selected integrated circuit 20 has a plurality of interconnect pads 29 that are pressed into contact with the bumps 17 on the bottom of the flexible membrane 21. This is generally accomplished by an operator using a microscope to manually align the bumps 17 and the pads 19 by imaging through the clear components of the probe 10. This provides for electrical interconnection of the selected integrated circuit 20 to the test equipment, so that the integrated circuit 20 may be tested. The spongy, flexible elastomer member 14 compresses during the interconnection operation, and deflects, as required, to permit proper mating of the bumps 19 and pads 29.

Typically, the wafer 15 is not level, and as such the pads 29 are sometimes tilted with respect to the surface of the flexible membrane 21 and its bumps 17. In such a case, the flexible elastomer member 14 compresses to allow tilting of the bumps 17 relative to the pads 29, and thus ensure proper interconnection of the integrated circuit 20. The external test equipment is connected to the plurality of termination pads 19 so that test signals may be routed to the integrated circuit die 15 to test it.

The chamfered cone shaped retainer 13 causes the flexible elastomer member 14 and clear plastic pressure and pivot plate 22 to self align in the opening 25 thereof which provides for repeatability when using the probe 10 to test multiple integrated circuits 20 on the die 15. The upward movement of the die 15 and integrated circuit 20 provides the requisite force to ensure contact between the bumps 17 and pads 29 and to tilt the flexible membrane 21 when required.

Thus there has been described new and improved pivotable self-centering elastomer pressure-wafer probe for use in testing integrated circuit die. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A test probe for testing an integrated circuit formed on an integrated circuit die, said probe comprising:
 a printed circuit board interface having an opening at its center;
 a flexible membrane formed on a first surface of the printed circuit board interface and which is flexible in the middle thereof adjacent the opening;
 a plurality of electrical traces disposed on the printed circuit board interface that provide for electrical connection to the integrated circuit;
 a window secured to a second surface of the printed circuit board interface that has a portion thereof that extends into the opening therein;
 a retainer having an opening at its center that is secured to the window;
 a elastomer member that abuts the window; and
 a pressure and pivot plate disposed between the flexible membrane and the pivotable elastomer member.

2. The test probe of claim 1 wherein the window is comprised of clear plastic.

3. The test probe of claim 1 wherein the window is comprised of acrylic.

4. The test probe of claim 1 wherein the retainer is cone shaped and has a stepped cross section with sloped outer and inner walls.

5. The test probe of claim 1 wherein the flexible membrane is comprised of copper coated polyimide.

6. The test probe of claim 1 wherein the printed circuit board interface is comprised of fiberglass.

7. The test probe of claim 1 wherein the retainer is comprised of stainless steel.

8. The test probe of claim 1 wherein the elastomer member is comprised of silicone.

9. The test probe of claim 1 wherein the pressure and pivot plate is comprised of clear plastic.

10. The test probe of claim 1 wherein the pressure and pivot plate is comprised of glass.

11. A test probe for testing an integrated circuit formed on an integrated circuit die, said probe comprising:
 a printed circuit board interface having an opening at its center;
 a flexible membrane formed on a first surface of the printed circuit board interface and which is flexible in the middle thereof adjacent the opening in the printed circuit board interface;

a plurality of electrical traces disposed on the printed circuit board interface that terminate at one end in a plurality of bumps that provide for electrical connection to the integrated circuit, and that terminate at opposite ends at a plurality of termination pads that permit interfacing of the integrated circuit to external test equipment;

a clear window secured to a top surface of the printed circuit board interface that has a portion thereof that extends into the opening in the printed circuit board interface;

a cone shaped retainer having a circular opening at its center that is secured to a bottom surface of the clear window;

a pivotable elastomer member that abuts the bottom surface of the clear window; and a clear pressure and pivot plate disposed between the flexible membrane and the pivotable elastomer member.

12. The test probe of claim 11 wherein the pivotable elastomer member has a truncated conical cross section.

13. The test probe of claim 11 wherein the clear window is comprised of acrylic.

14. The test probe of claim 11 wherein the cone shaped retainer is circular and has a stepped cross section with sloped outer and inner walls.

15. The test probe of claim 11 wherein the flexible membrane is comprised of copper coated polyimide.

16. The test probe of claim 11 wherein the printed circuit board interface is comprised of fiberglass.

17. The test probe of claim 11 wherein the cone shaped retainer is comprised of stainless steel.

18. The test probe of claim 11 wherein the pivotable elastomer member is comprised of silicone.

19. The test probe of claim 11 wherein the clear pressure and pivot plate is comprised of clear plastic.

20. The test probe of claim 11 wherein the clear pressure and pivot plate is comprised of glass.

* * * * *